Figure 1:
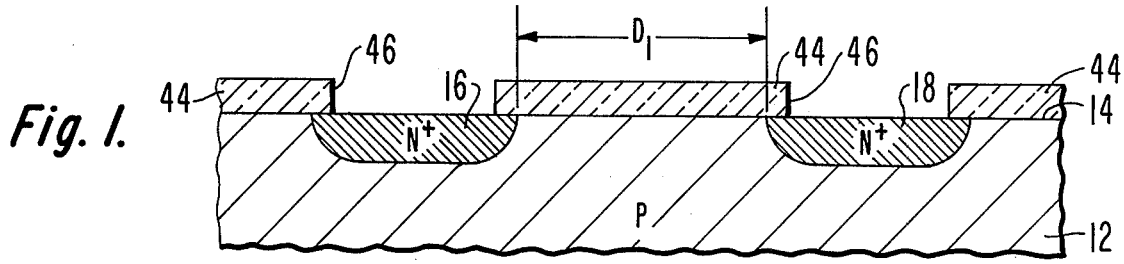

United States Patent [19]

Jacobus, Jr.

[11] 4,108,686
[45] Aug. 22, 1978

[54] METHOD OF MAKING AN INSULATED GATE FIELD EFFECT TRANSISTOR BY IMPLANTED DOUBLE COUNTERDOPING

[75] Inventor: Lewis Alfred Jacobus, Jr., Middlesex, N.J.

[73] Assignee: RCA Corp., New York, N.Y.

[21] Appl. No.: 818,065

[22] Filed: Jul. 22, 1977

[51] Int. Cl.² .......................... H01L 7/54; H01L 29/78
[52] U.S. Cl. ........................................ 148/1.5; 357/23; 357/91
[58] Field of Search ....................... 148/1.5; 357/23, 91

[56] References Cited

U.S. PATENT DOCUMENTS

| 3,387,358 | 6/1968 | Heiman | 29/571 |
|---|---|---|---|
| 3,615,934 | 10/1971 | Bower | 148/186 |
| 3,653,978 | 4/1972 | Robinson et al. | 148/1.5 |
| 3,725,136 | 4/1973 | Morgan | 148/1.5 |
| 3,814,992 | 6/1974 | Kump et al. | 357/23 |
| 4,017,888 | 4/1977 | Christie et al. | 357/54 |
| 4,021,835 | 5/1977 | Etoh et al. | 357/23 |

OTHER PUBLICATIONS

Moline et al., "Self-Aligned . . . Chan Stops . . . IGFET . . . ", IEEE, ED-20, (1973), 1129.
Fang et al., ". . . MOS. . . Using the Ion-Impln. . . . ", IEEE, vol. SC-10, No. 10, (1975), 265.
Runge, H., "Threshold Voltage . . . by Ion Impln.", Electr. Engr., Jan. 1976, p. 41.
Masuhara et al., ". . . MOSFET . . . by Ion Implantation", IEEE-Electron Device Meeting, 1974, p. 397.

Primary Examiner—L. Dewayne Rutledge
Assistant Examiner—Upendra Roy
Attorney, Agent, or Firm—H. Christoffersen; R. P. Williams; Sanford J. Asman

[57] ABSTRACT

An insulated gate field effect transistor having spaced highly doped source and drain regions with less highly doped source and drain extensions, which define the ends of the channel of the transistor, has both the source and drain extensions and the channel of the transistor defined in a controllable manner by the steps of forming a continuous zone of the same conductivity type as the source and drain regions in the space between these two regions and then counterdoping a portion of this layer.

7 Claims, 5 Drawing Figures

U.S. Patent     Aug. 22, 1978     4,108,686

METHOD OF MAKING AN INSULATED GATE FIELD EFFECT TRANSISTOR BY IMPLANTED DOUBLE COUNTERDOPING

This invention relates to a method for making a semiconductor device, particularly an insulated gate field effect transistor.

One known method of fabricating insulated gate field effect transistors is to form spaced source and drain regions of one type conductivity in a semiconductor substrate of the opposite type conductivity by diffusing conductivity modifiers into the substrate from a gaseous or solid source. The known doped oxide diffusion method, involving diffusion from doped oxide blocks on the surface of the substrate is then used to form lightly doped source and drain extensions, the ends of which define the ends of the channel region of the device and connect the channel region to more heavily doped source and drain regions, formed for example by conventional diffusion techniques. The more lightly doped source and drain extensions improve the output resistance and drain-source breakdown voltage of the device. One of the benefits of this process is that the doped oxide blocks can also be used as a mask in forming a relatively thin gate insulator. A gate electrode may be disposed on the gate insulator in non-critical alignment with portions thereof overlapping the relatively thicker doped oxide blocks. This reduces the undesirable capacitances of the portions of the gate electrode which overlap the source and drain extensions. It is difficult, however, to control the exact amount of conductivity modifiers which diffuse into the substrate from the doped oxide blocks to form the lightly doped source and drain extensions. Too heavy a doping results in low drain to source breakdown voltage, while too light a doping introduces significant source or drain to channel resistance.

Ion implantation has been used as a method of forming source and drain regions and extensions thereof. Bower, U.S. Pat. No 3,615,934 describes one method by which a so-called self-aligned gate transistor may be fabricated. An insulated gate electrode structure is used as a mask in an ion implantation process in which ions are implanted on both sides of the gate electrode structure to form source and drain extensions. The ends of the extensions which are adjacent to the gate electrode structure define the ends of the channel region of the device. By using the gate itself as the mask, overlap of the gate and the source and drain extensions is minimized, leading to a considerable reduction in parasitic capacitance compared to transistors formed by the doped oxide method. Since ion implantation is a highly controllable process, improved control over the amount of dopant which is introduced into the source and drain extensions is achieved.

Ion implantation has also been used to control the doping in the channel region of an insulated gate field effect transistor and hence the threshold voltage of the device. Introduction of conductivity modifiers of the same type as the substrate into the channel increases the threshold voltage of the device, while the introduction of opposite type modifiers decreases the threshold voltage. Processes are also known in which both the same and opposite type modifiers are implanted into a channel, usually for the combined effect of each. See for example Masuhara et al, IEEE Electron Devices Meeting, 1974, pages 397–399.

Lacking in the art however, is any teaching of how ion implantation processes may be used to provide control over all of (a) drain to source breakdown voltage, (b) channel length, and (c) threshold voltage, in a single device.

In the Drawings:

FIGS. 1-5 are a series of cross-sectional views illustrating a succession of steps in the present novel process.

Figure 5:
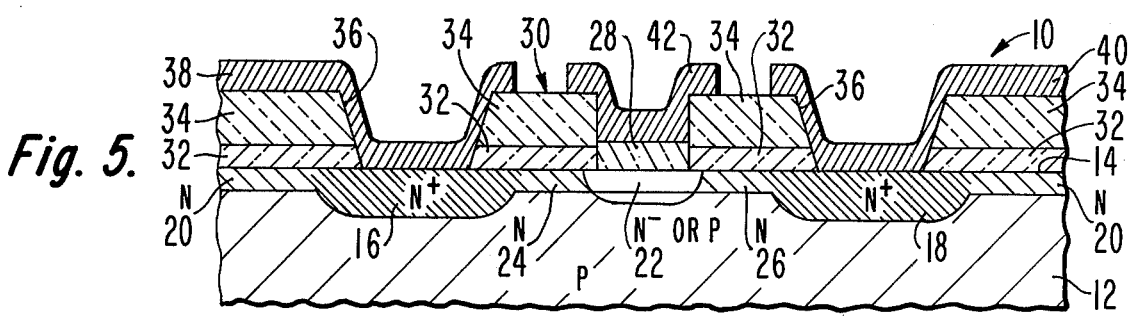

FIG. 5 represents, diagrammatically, an insulated gate field effect transistor 10 formed by the present method. The transistor 10 includes a body 12 of semiconductive material, preferably silicon, having an upper surface 14 adjacent to which the various processing steps to be described below are carried out. The body 12 is of one type conductivity, P type in this example, having a resistivity between about 20 and about 50 ohm-cm. Within the body 12 and adjacent the surface 14 thereof are spaced source and drain regions 16 and 18. In the example illustrated, the structure is symmetrical so that in use these regions 16 and 18 are interchangeable. As suggested by the designation N+ within these regions 16 and 18, they are relatively highly doped to the conductivity type opposite to that of the body 12. Adjacent to those portions of the surface 14 which are not occupied by the regions 16 and 18 is a zone 20 which is also of the opposite type conductivity but contains substantially fewer modifiers than the regions 16 and 18.

A channel region 22 is adjacent to a portion of the surface 14 which is located between the regions 16 and 18 and has predetermined dimensions. The width of the channel region 22 is less than the spacing between the regions 16 and 18, i.e. the zone 20 has dimensions larger than those of the channel region 22, so that portions 24 and 26 of the zone 20 remain as source and drain extensions. The conductivity type of the channel region 22 may be either N type or P type, or the channel region 22 may be exactly compensated. In the example shown this region is labelled N— or P. With N- type conductivity the channel is operable in the depletion mode and with P type conductivity it is operable in the enhancement mode.

On the surface 14 are layers of insulating material. On the portion of the surface 14 which overlies the channel region 22 is an insulator 28 which has the characteristics of a gate insulator. At other locations, there is a relatively thick insulator 30 which, in this example, is made up of two layers, that is, a first layer 32 adjacent to the surface 14 and a layer 34 on the layer 32. This insulator structure results from one example of the present process as will appear below. Openings 36 are present in the insulator 30 over the regions 16 and 18. Metal contacts 38 and 40 extend through the openings 36 to contact the regions 16 and 18, respectively. A gate electrode 42 is on the gate insulator 28 and will usually have portions extending up onto the insulator 30 in the same manner as in prior doped oxide type structures.

The transistor 10 is fabricated as follows. The specific steps characteristic of the present process are described. Conventional steps such as etching, washing, and photolithographic steps are not illustrated, for convenience.

With reference to FIG. 1, the surface 14 of the body 12 is first provided with a diffusion masking coating 44 which is provided in conventional fashion, with openings 46 to define the locations and areas of the regions 16 and 18. These regions are then introduced into the body 12 by conventional diffusion processes. They are spaced from each other by a predetermined distance labeled in FIG. 1 as $D_1$.

Figure 2:
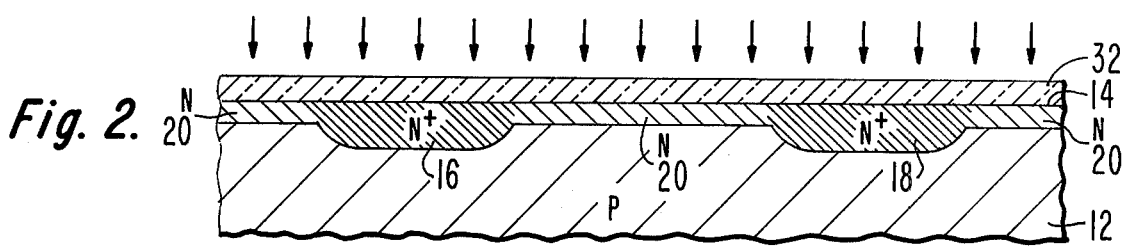

The next steps are illustrated in FIG. 2. The masking coating 44 is removed from the surface 14 and is replaced by a relatively thin layer 32 of a material which will protect the surface 14 in the ion implantation step which is to follow. The body 12 is then placed in conventional ion implantation apparatus and a nonselective implantation of opposite type modifiers is done to establish the zone 20 across all of the surface 14. If desired, this implantation may be done selectively, but the zone 20 should be formed to at least span the space between the regions 16 and 18. The conditions of this implantation are not critical to the present invention and may be varied as desired to control or adjust the amount of modifiers in the zone 20, and thus its conductivity. For example, however, where the body 12 is P type, doped with boron to a resistivity of 20 ohm-cm and where the protective coating 32 is thermally grown silicon dioxide having a thickness of 1000A, the zone 20 may be made by ion implantation of phosphorus at an energy of 80 KeV and a dosage of $6.8 \times 10^{13}$ modifiers/cm$^2$.

Next, if desired, the body 12 can be heated to redistribute the modifiers in the zone 20 and to drive the zone 20 to a desired depth within the body 12. Alternatively, a final redistribution of impurities can be done after all implantation steps described herein.

Figure 3:
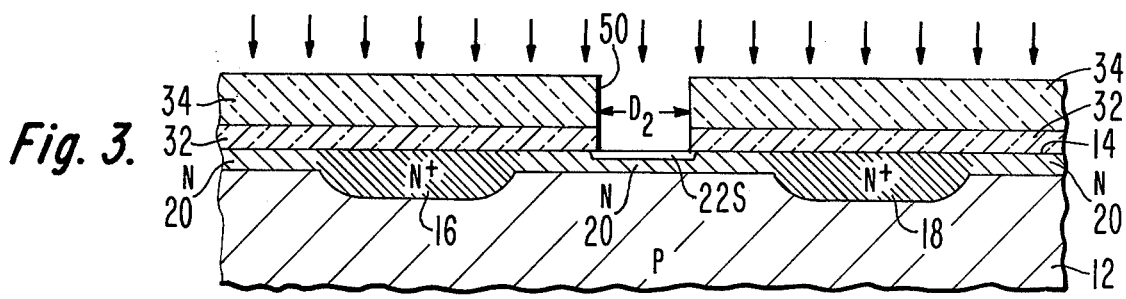

The next steps are illustrated in FIG. 3. An insulating layer 34 is next deposited on the oxide layer 32. Preferably, the insulating layer 34 is silicon dioxide formed by the pyrolytic decomposition of silane (SiH$_4$) in oxygen, in known manner. By means of a standard photolithographic process, an opening 50 having a width of $D_2$ which is less then the spacing $D_1$ between the regions 16 and 18 is provided. The body 12 is next subjected to a heat treatment in an oxidizing ambient to grow the channel oxide 28. The body 12 is then again subjected to ion implantation to introduce into the body 12, through a portion of the surface 14 defined by the opening 50, conductivity modifiers of the one type, that is, the same type as the body 12. The result of this step is the establishment of a surface-adjacent region 22S, i.e. a diffusion source region for the channel region 22. Assuming that the above described processing conditions have taken place, the implantation in this step may be of boron at an energy of 30 KeV and a dosage of $1 \times 10^{14}$ modifiers/cm$^2$.

Figure 4:
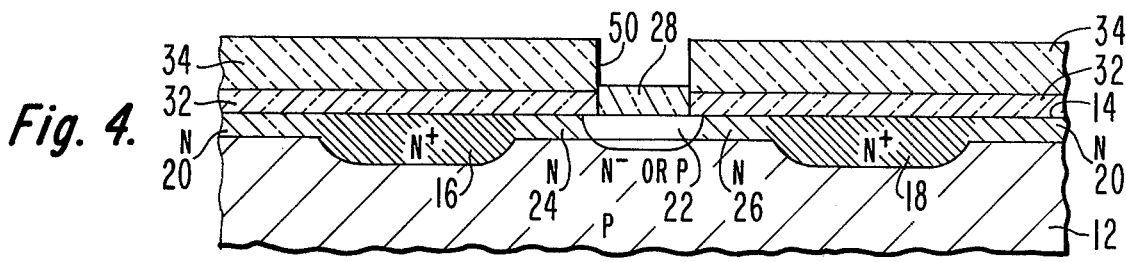

Upon completion of this implantation step, the body 12 is next subjected to a heat treatment in an inert atmosphere to redistribute boron and phosphorus in the region 22. The result of this step is shown in FIG. 4. The conditions of this step are chosen such that a portion of the zone 20 which is adjacent to the portion of the surface 14 which has been defined by the opening 50 is converted from the original N type conductivity toward P type conductivity. As stated above, the conductivity of the channel 22 is controllable in the present process, and if conductivity modifiers of the one type are introduced in a relatively small amount, this amount will be inadequate to convert the portion 22 back to P type conductivity so that the resulting device is a depletion mode device. If more boron is introduced, the amount will be adequate to convert the region 22 back to P type conductivity, with the result that the device is an enhancement device.

The process is completed in conventional fashion by providing the openings 36, that is, contact openings for the regions 16 and 18, and depositing and defining the conductors 38, 40, and 42 respectively.

While it has been shown and is preferred that the channel region 22 is symmetrically located between the regions 16 and 18, it is possible to offset this region toward one or the other of the regions 16 and 18. Any such offset will increase the resistance between the channel region 22 and the more remote one of the regions 16 and 18 and this increased resistance may be useful in some circuit applications.

As should be apparent, the two ion implantation steps used in this method provide for a wide degree of control over the doping in the zone 20 and the channel region 22 leading to wide variation in the available drain-to-source breakdown voltage and threshold voltage of the device. A designer is thus able to provide a device which will meet a given set of specifications by the relatively simple expedient of changing the implantation conditions. Moreover, the channel length of the device is highly controllable.

What is claimed is:

1. A method of making an insulated gate field effect transistor in a body of semiconductor material of one type conductivity and having a surface, said transistor having a channel region of predetermined length adjacent to said surface comprising the steps of forming a source region and a drain region each having a conductivity type opposite that of said body in said body adjacent to said surface, said regions having a predetermined distance therebetween greater than said predetermined length forming a zone having a conductivity type opposite to that of said body in said body adjacent to said surface, said zone extending between and being less conductive than said regions, forming said channel region by introducing conductivity modifiers of said one type into said zone over said predetermined length to convert that portion of said zone toward said one type conductivity, forming a gate insulator on said channel region, and forming a conductive gate on said gate insulator.

2. The method of claim 1 wherein said step of forming said channel region is carried out by forming a masking layer on said surface, removing a portion of said masking layer located between said regions, the dimension of said portion of said surface in the direction between said regions being of said predetermined length to expose said surface, and introducing said conductivity modifiers of said one type into said body through said exposed surface.

3. The method of claim 2 wherein said step of forming said zone is accomplished by ion implanting conductivity modifiers into said body across all the surface thereof.

4. The method of claim 2 wherein the center of said predetermined length is coincident with the center of said predetermined distance.

5. The method of claim 2 wherein said step of forming said channel region is accomplished by ion implantation.

6. The method of claim 5 wherein said conductivity modifiers of said one type are introduced in an amount insufficient to convert said predetermined length of said zone to said one type conductivity.

7. The method of claim 5 wherein said conductivity modifiers of said one type are introduced in an amount adequate to convert said predetermined length of said zone to said one type conductivity.

* * * * *